United States Patent [19]
Wang et al.

[11] Patent Number: 5,524,012
[45] Date of Patent: Jun. 4, 1996

[54] TUNABLE, MULTIPLE FREQUENCY LASER DIODE

[75] Inventors: Chi-Luen Wang; Ci-Ling Pan, both of Hsinchu, Taiwan

[73] Assignee: New Focus, Inc., Santa Clara, Calif.

[21] Appl. No.: 329,891

[22] Filed: Oct. 27, 1994

[51] Int. Cl.[6] ........................................ H01S 3/10
[52] U.S. Cl. ................... 372/23; 372/20; 372/99; 372/102; 372/107
[58] Field of Search ........................ 372/23, 99, 102, 372/107, 20

[56] References Cited

U.S. PATENT DOCUMENTS 4,733,253  3/1988  Daniele ............................ 372/24
5,319,668  6/1994  Luecke ............................ 372/107

*Primary Examiner*—Rodney B. Bovernick
*Assistant Examiner*—Robert E. Wise
*Attorney, Agent, or Firm*—Hugh D. Jaeger

[57] ABSTRACT

A diode laser utilizing a grazing incidence grating in combination with collimating and refocusing devices and a mirror having a plurality of spaced reflective areas which are effective to return different wavelengths to the grating and thence to the laser to sustain oscillation at the reflected frequencies with tuning of the frequencies accomplished by translation of the mirror to position the reflective areas to change the reflected wavelengths.

20 Claims, 5 Drawing Sheets

TUNABLE, MULTIPLE FREQUENCY LASER DIODE

BACKGROUND OF THE INVENTION

1. Field of the Invention the present invention relates to multiple frequency tunable diode lasers utilizing a grazing incidence grating cavity.

2. Description of the Prior Art various techniques for the simultaneous generation of selectable wavelengths from a single diode laser exist in the prior art. Multichannel grating cavity lasers such as described by I. H. White "A Multichannel Grating Cavity Laser For Wavelength Division Multiplexing Applications," IEEE Journal of Lightwave Technology, Vol. 9, No. 7, July 1991, pp. 893–898.

Another device for this purpose is described by K. O. Nyario, et al., "Multiple Channel Signal Generation Using Multichannel Grating Cavity Laser With Crosstalk Compensation," Electronics Letters, Vol. 28, No. 3, 30 January 1992, pp. 261–263. The device utilizes a multichannel grating cavity laser in which multiple stripes are driven simultaneously.

A single output, variable wavelength device is described by J. B. D. Soule, et al., "Wavelength-Selectable Laser Emission From A Multistripe Array Grating Integrated Cavity Case," Applied Physics letters, Vol. 61, No. 23, 7 December 1992, pp. 2750–2752. In this device, single output/selectable wavelength operation was obtained by blazing a single "output" stripe and injection pumping different second stripes in order to obtain lasing at different wavelengths.

The improvement to the preceding device set forth by Doguntka, et al., "Simultaneous Multiple Wavelength Operation of a Multistripe Array Grating Integrated Cavity Laser," Applied Physics Letters Vol. 62, No. 17, 28 April 1993, pp. 2024–2026, achieves simultaneous multiwavelength operation by simultaneously injection pumping a number of different second stripes together with a single output stripe.

The preceding prior art systems all suffer from the deficiency discussed by M. C. Farries, et al., in "Tunable Multiwavelength Semiconductor Laser With Single Fibre Output," Electronics Letters, Vol. 27, No. 17, 15 August 1991, pp. 1498–1499. Specifically, these devices require a complex semiconductor die. The system of this publication uses an external casing consisting of a fiber optic loop mirror with two output ports fusion spliced to form a Sagnac interferometer.

A publication by G. C. Paden, et al., "Multiple Wavelength Operation Of A Laser-Diode Array Coupled To An External Cavity," Optics letters, Vol. 18, No. 17, Sep. 1, 1993, pp. 1441–1443, utilizes a multiple diode array coupled to a single cavity such that each diode lases at a different wavelength.

G. R. Hadley, et al., in "Free-Running Modes For Gain-Guided Diode Laser Arrays," Journal of Quantum Electronics, Vol. QE-23, No. 6. June 1987, pp. 765–774, presented a numerical model for analysis of gain-guided diode laser arrays.

Further analysis of gain guided (multistripe) diode laser arrays is presented by J. M. Verdiell, et al., "A Broad-Area Mode-Coupling Model For Multiple-Stripe Semiconductor Lasers," Journal of Quantum Electronics, Vol. 26, No. 2, February 1990, pp. 270–279.

The prior art systems require either a complex multistripe semiconductor die or voltage diodes to achieve variable, multiple frequency operation.

SUMMARY OF THE INVENTION

The general purpose of this invention is to provide a multiple output frequency diode laser in which the frequency is easily changed by simple mechanical translation of a mirror having spaced reflective areas.

According to one embodiment of the present invention, the collimated output beam from a diode laser impinges on a diffraction grating at a grazing angle and the first order diffracted beam is refocused and directed to a mirror having spaced apart reflective areas to return different wavelength portions of the collimated first order diffracted beam back to the diode. Since the position of the reflective areas determines the wavelength of the returned beam, the wavelength may be altered by changing the position of the mirror to reflect portions of the beam which are diffracted at different angles.

The location and geometry of the reflective areas determines the effect on the frequency which results from mechanical movement of the mirror. It is possible to arrange the reflective areas in a "V" shape with the legs of the "V" at equal angles to the direction of translation of the mirror to provide simultaneous changes in two output wavelengths. Alternatively, one leg of the "V" can be oriented parallel to the direction of movement to provide one fixed frequency output and one output frequency which is varied as the mirror is translated.

In addition to changing frequency, it is possible, by changing the width of the slit, to control the output power of the laser. This aspect of the invention is useful in controlling the output power of the laser which would otherwise vary as the frequency is changed.

One significant aspect and feature of the invention is a diode laser system which provides the simultaneous generation and variation in wavelength of two or more outputs.

Another significant aspect and feature of the invention is a multiple wavelength diode laser system in which the frequency and power of the multiple outputs are easily controlled by mechanical translation of a reflective element.

A further significant aspect and feature of the invention is a multiple wavelength diode laser system utilizing a reflective device as a filter for multiple wavelength operation.

Still another significant aspect and feature of the invention is an easily tunable, multiple wavelength diode laser system, having coaxial output beams.

Yet another object of the invention is to provide a multiple wavelength diode laser system utilizing mechanical translation of a reflective device for selection of the output wavelength.

An additional significant aspect and feature of the invention is a multiple wavelength diode laser system in which the output characteristics are easily modified by the substitution of a single, simple, reflective element.

A still further significant aspect and feature of the invention is a multiple wavelength diode laser system in which the output frequency and power characteristics are determined by the geometric pattern of reflective areas on a translatable element.

Having thus described embodiments of the present invention, it is the principal object of the invention to provide an improved, multiple output wavelength, diode laser system utilizing an external grating cavity which includes a device having a geometric reflective pattern which allows for the independent control of wavelength and power for each output.

One object of the present invention is to provide a diode laser system which develops two or more outputs which may be simultaneously varied in wavelength.

Another object of the present invention is to provide a multiple wavelength diode laser system in which the frequency and power of the multiple outputs are easily controlled by mechanical translation of a reflective element.

A further object of the present invention is to provide a multiple wavelength diode laser system utilizing a reflective device as a filter for multiple wavelength operation.

Still another object of the present invention is to provide an easily tunable, multiple wavelength, diode laser system having coaxial output beams.

Yet another object of the present invention is to provide a multiple wavelength diode laser system which utilizes mechanical translation of a reflective device for selection of the output wavelength.

An additional object of the present invention is to provide a multiple wavelength diode laser system in which the output characteristics are easily modified by the substitution of a single, simple, reflective element.

A still further object of the present invention is to provide a multiple wavelength diode laser system in which the output frequency and power characteristics are determined by the geometric pattern of reflective areas on a translatable element.

BRIEF DESCRIPTION OF THE DRAWINGS

Other objects, features and advantages of the present invention will be readily appreciated as the same becomes better understood with reference to the following, more detailed description when considered with reference to the accompanying drawings, in which like reference characters designate like parts throughout the figures thereof and wherein.

DETAILED DESCRIPTION OF THE PREFERRED EMBODIMENTS

Figure 1:
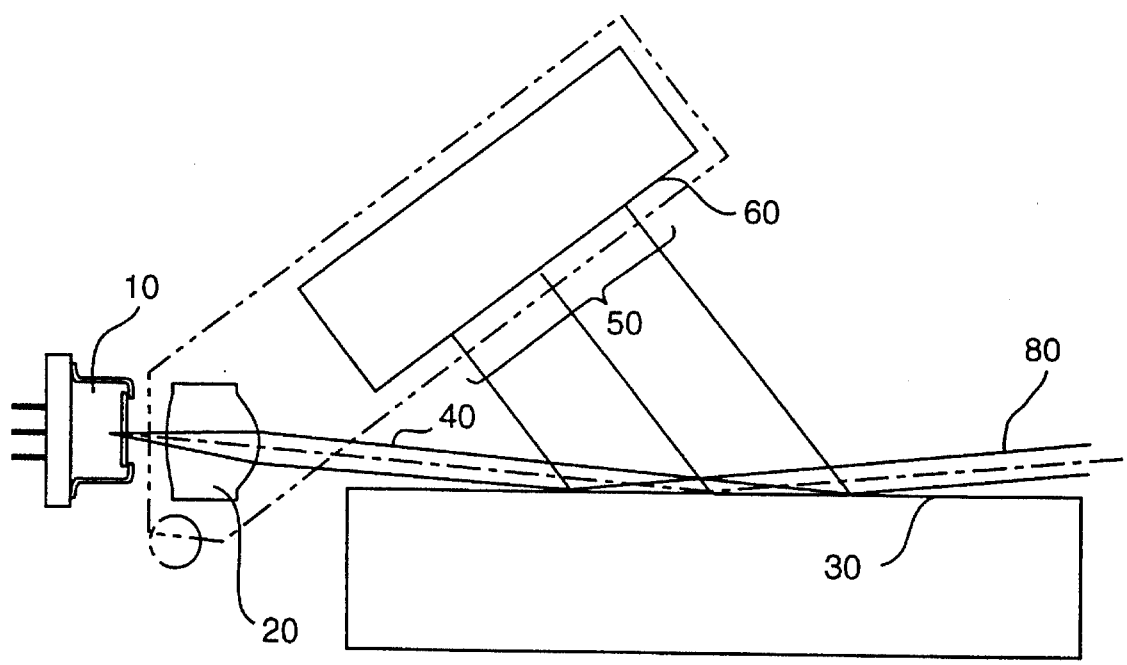
FIG. 1 illustrates a prior art diode laser system utilizing a external cavity including a grazing incidence diffraction grating.

The prior art tunable laser diode system shown in FIG. 1 includes a diode laser 10, a collimating lens 20, and a diffraction grating 30, arranged to intercept the collimated output beam 40 at a grazing angle. The first order diffraction beam 50 strikes the reflective device such as mirror 60 to provide a return beam to diode laser 10 and thereby sustain oscillation at a wavelength determined by the diffraction angle of the first order diffraction beam 40 perpendicular to mirror 60. The output wavelength of laser 10 may be varied by changing the angle of mirror 60 so as to reflect a different wavelength from the diffraction grating 30. Such a system is described in more detail in U.S. Pat. No. 5,319,668 tuning system for diode laser, issued Jun. 7, 1994, assigned to the assignees of this application, and incorporated herein by reference.

Figure 2:
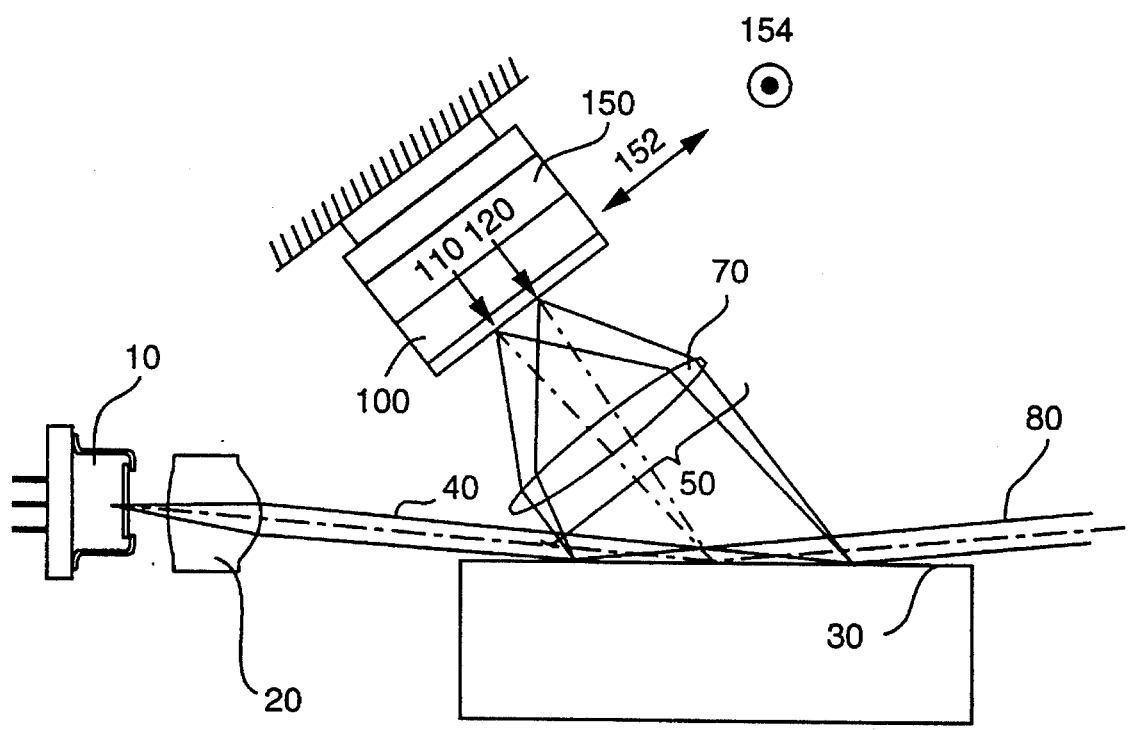
FIG. 2 is a schematic illustration of the diode laser system of this invention in which the external cavity includes a collimating device and a mechanically translatable reflective element having a geometric pattern for generation and control of multiple output wavelengths.

The tunable, multiple frequency diode laser system of this invention shown in FIG. 2 utilizes some of the elements of the prior art system shown in FIG. 1. The diode laser 10 is preferably a 10-strip, phase-locked, laser diode array such as that sold by Spectra Diode Labs Model SDL-2419C, wavelength=0.8 um. The chip length of laser diode 10 is 250 um. The rear facet has a high reflectivity coating with a reflectivity R>95%, and an antireflection coating on the front facet provides a reflectivity R<0.1%. Diffraction grating 30, having 1800 lines/mm may be of the type sold by American Holographic, Model 135.1800, and is positioned at grazing incidence with respect to collimated output beam 40. Diffraction grating 30 is employed for wavelength selection and output coupling back into the diode laser 10. The external grating cavity is formed by the high reflectivity coating on the rear facet of diode 10, collimating lens 20, diffraction grating 30, focusing lens 70 and the reflective device 100 having spaced reflective areas 110 and 120, which will be later described in more detail.

The collimated output beam 40 is developed by lens 20, which is typically a 20x. 0.5 NA microscope objective. The grating 30 is positioned at an angle to provide a 79 degree angle of incidence to collimated output beam 40. The first order diffraction beam 50 is focused by an antireflection coated, 150 mm focal length lens 70 onto the reflective device 100.

The multiple frequency output beam 80 provides a coaxial beam.

Reflective device 100 is supported by a two-axis translation device 150 which may be of the type manufactured and sold by New Focus, Inc. 1275 Reamwood Ave., Sunnyvale, Calif. 94089-2256 (408) 734-8988 as "X-Y Positioner" Model 8051. The translation device provides movement along the axis shown as 152, which is plane parallel to the plane of reflective device 100 and along the axis 154, perpendicular to axis 152 and also plane parallel to the plane of reflective device 100.

Figure 3:
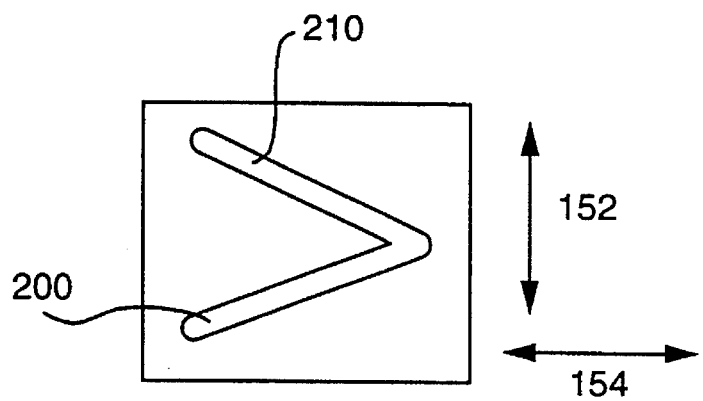
FIG. 3 illustrates the geometry of the reflective pattern for a diode laser system according to this invention which generates two, simultaneously variable, output wavelengths.

The front face of one embodiment of reflective device 100 is shown in FIG. 3, which also illustrates the orientation of the translation axes 152 and 154. The "V" shaped reflective area is formed by a first reflective area 200 and a second reflective area 210, which are preferably formed by means of a photographic film placed next to the mirror. The angle between the area 200 and area 210 is 15 degrees in the selected case but may be altered in accordance with the desired characteristics of the device. The width of each slit is selected to be about 0.3 mm, but this may also be altered to provide desired characteristics. Since the width of the slit determines the level of output power fed back in to laser 10 it must be sufficiently wide to feed back the level of power necessary to sustain oscillation. The width of the slit also determines spectral purity of the output beam. It has been found that the selected width is sufficient for suppression of the side-modes of the output of laser 10 at the two output wavelengths.

The spectral separation of the two resonant wavelengths is defined by the equations:

$$\Delta\lambda = \frac{d}{m}(\sin\Theta_1 - \sin\Theta_2), \quad (1)$$

$$W = L(\tan\theta_1 - \tan\theta_2), \quad (2)$$

where $\Delta\lambda$ is the wavelength separation; d is the grating period, w is variable and corresponds to the spacing between the centers of the two slits; m is the diffraction order; L=300 mm is the distance from diffraction grating 30 to the reflective device 100 and $\theta_1$ and $\theta_2$ are the first order diffraction angles at about 27 degrees to the normal of grating 30.

MODE OF OPERATION

Figure 9:
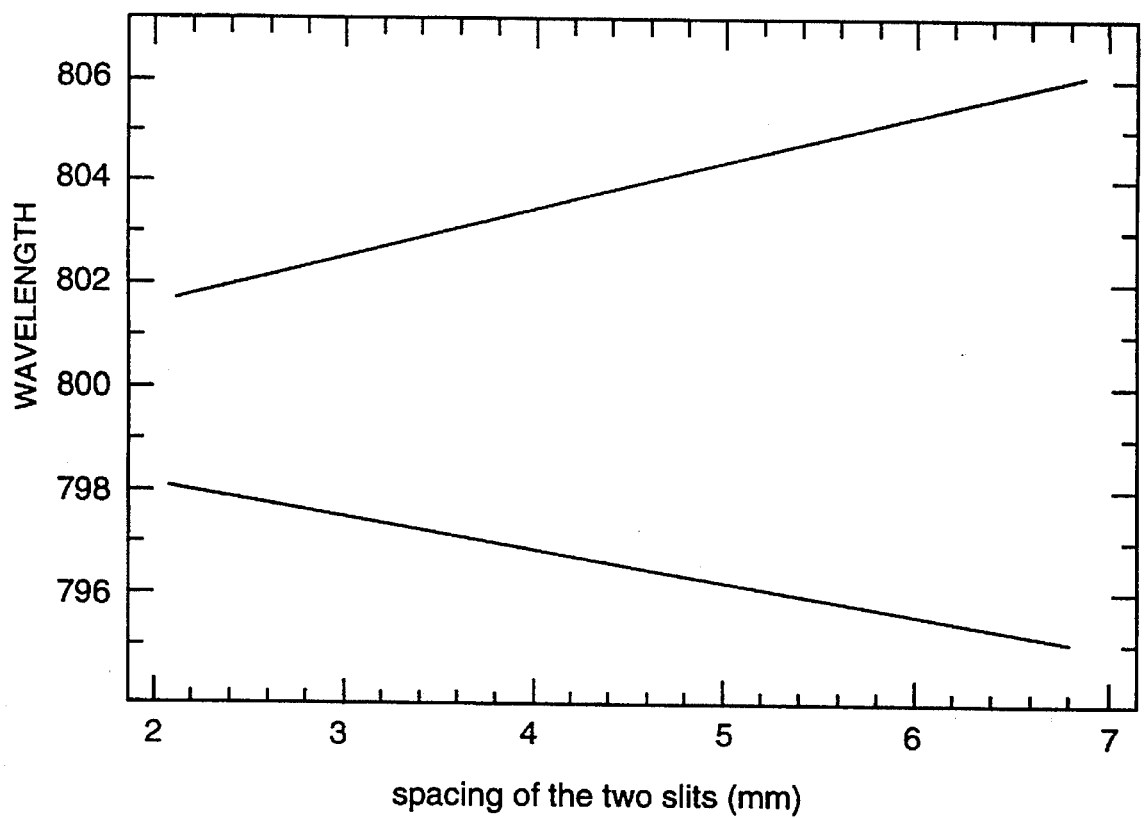
FIG. 9 is a graphical representation of the output wavelengths as a function of the spacing between two slits in the reflective means; and, FIG. 10 is a graphical representation of the output wavelengths as the position of the two slits is varied and the spacing between the slits remains constant.

The graph of FIG. 9 represents the output wavelengths as a function of the spacing between the reflective areas 110 and 120. The effective spacing between the slits is varied by energizing translating means 150 to move the reflective device along axis 154. In this fashion, the portion of the "V" shaped slit upon which the first order diffraction beam impinges may be varied. When the first order diffraction beam impinges on the slit near the closed end of the "V", the difference in wavelength between the two output wavelengths is relatively small and becomes greater at the open end of the "V".

Figure 10:
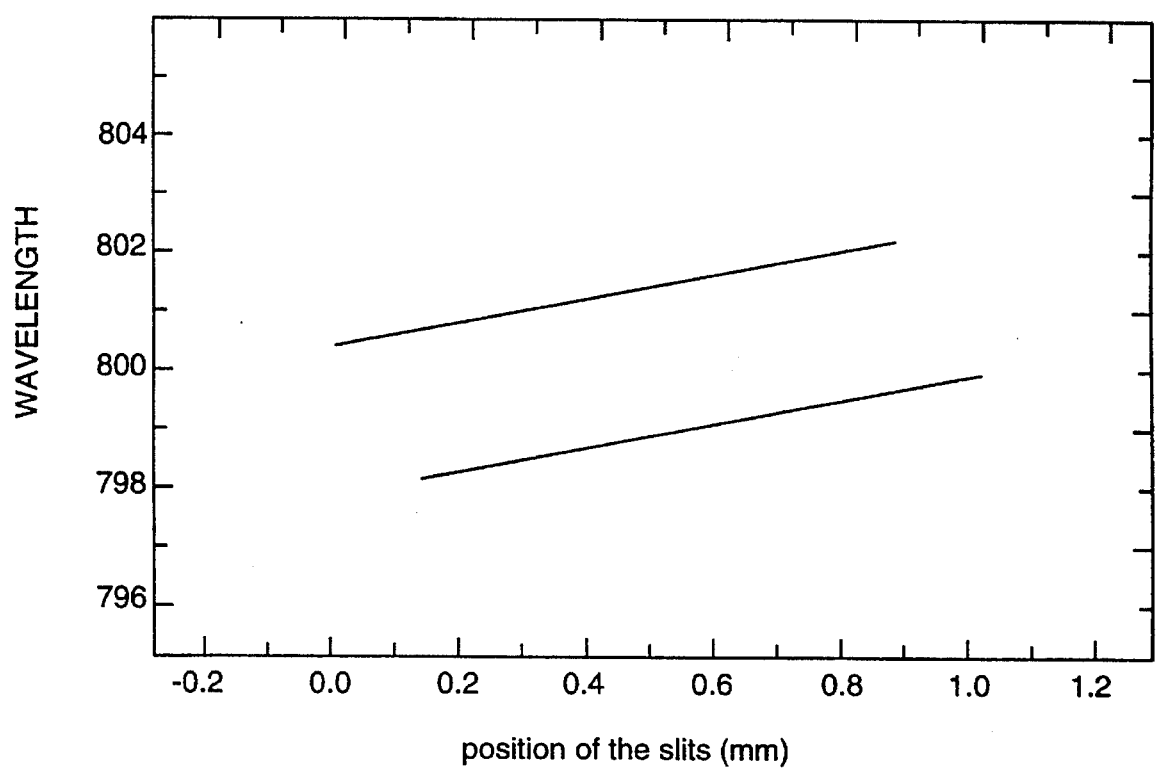

Certain applications require the difference in output wavelengths to remain constant while the absolute wavelengths are simultaneously varied. The invention easily accommodates this requirement by translating the reflective device along the axis 152, perpendicular to the axis 154. Changing the position of reflective device 100 along axis 152 causes each output wavelength to change in the same direction. The graph of FIG. 10 illustrates this mode of operation. As the position of the reflective device is translated along the axis 152, the wavelength of both outputs change in the same direction while maintaining a constant difference between the outputs.

By adjusting the vertical position of the slits with respect to the optical axis, the laser can be adjusted to provide equal output power for the two wavelengths. For these positions, the two laser modes on opposite slopes of the gain profile experience equal gain.

Figure 4:
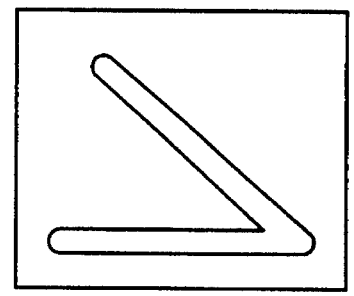
FIG. 4 illustrates the geometry of the reflective pattern for a diode laser system according to this invention which simultaneously generates two output wavelengths, one of which has fixed wavelength and another which is variable.
Figure 5:
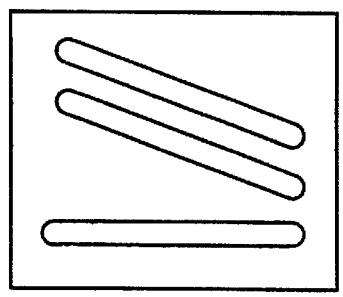
FIG. 5 illustrates the geometry of the reflective pattern for a diode laser system according to this invention which simultaneously generates three output wavelengths, one of which has fixed wavelength and the other two of which are variable.
Figure 6:
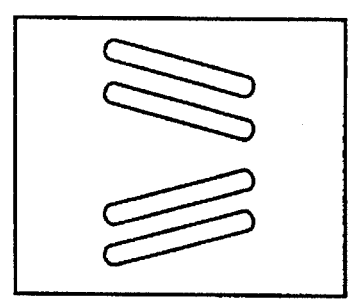
FIG. 6 illustrates the geometry of the reflective pattern for a diode laser system according to this invention which simultaneously generates four variable output wavelengths.

Various other geometric slit patterns suitable for use in the invention are shown in FIGS. 4–8. The slit pattern of FIG. 4 provides two simultaneous output wavelengths, one of which is fixed in value and the other variable. The pattern shown in FIG. 5 is suitable for simultaneously generating one fixed and two variable output wavelengths. The pattern illustrated in FIG. 6 simultaneously generates two pairs of variable output wavelengths, each pair of which differs from the other pair by a variable amount while the wavelength difference within pairs of wavelengths remains the same.

Figure 7:
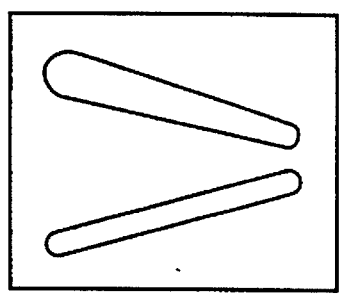
FIG. 7 illustrates the geometry of the reflective pattern for a diode laser system according to this invention which simultaneously generates two variable output wavelengths, one of which has the output power controlled by the width of the reflective pattern.
Figure 8:
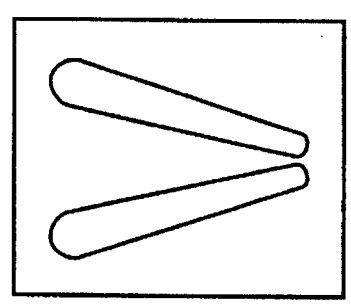
FIG. 8 illustrates the geometry of the reflective pattern for a diode laser system according to this invention which simultaneously generates two variable output wavelengths, both of which have the output power controlled by the width of the reflective pattern.

The pattern of FIG. 7 utilizes a semi-"V" shaped reflective area having a non-uniform stripe width for one of the legs of the "V". In this embodiment of the invention, the output power of the wavelength controlled by the variable width stripe pattern width varies in accordance with the reflective area, the wider stripe producing a higher output power. By varying the width of the reflective area, changes in output power due to gain bandwidth limitations of diode 10 may be avoided. FIG. 8 shows a "V" shaped reflective area in which both legs of the "V" have a variable width.

Various departures may be made to the present invention without departing from the scope of the claims.

What is claimed is:

1. A multiple frequency external cavity diode laser comprising:
   a. a diode laser having an output beam;
   b. a collimating lens positioned in said output beam;
   c. a diffraction grating positioned to be impinged by said collimated output beam and provide a first order diffraction beam from said output beam;
   d. reflective means, positioned to be impinged by said first order diffraction beam;
   e. focus means for bringing said first order diffraction beam to a focus on said reflective means;
   f. said reflective means having a plurality of reflective areas positioned to reflect only those portions of said focused first order diffraction beam emerging from said diffraction grating at different diffraction angles, whereby the oscillation of said laser is maintained at frequencies corresponding to the diffraction angles of said reflected first order diffraction beams.

2. A device according to claim 1 wherein said reflective areas are oriented to intercept and reflect two portions of said focused first order diffraction beam whereby said laser simultaneously oscillates at two wavelengths.

3. A device according to claim 2 further including: mirror support means for translation of said mirror along a first axis, transverse to the optical axis of said first order diffraction beam, whereby the pattern of reflective areas may be moved to intercept different portions of said first order diffraction beam and thereby also provide different operating wavelengths of said laser.

4. A device according to claim 3 wherein said plurality of reflective areas comprise a "V" shaped pattern.

5. A device according to claim 4 wherein the legs of the "V" shaped pattern are disposed at equal angles with respect to the axis of translation to provide equal changes in wavelength when said mirror is translated along said first axis.

6. A device according to claim 3 wherein said reflective areas comprise:
   a. a first reflective area extending along a line positioned parallel to an axis of translation of said mirror;

b. a second reflective area extending along a line positioned at an angle with respect to the axis of translation of said mirror.

7. A device according to claim 6 wherein said first and second reflective areas are relatively narrow with respect to the width of said collimated first order diffraction beam to provide laser output wavelengths of high spectral purity.

8. A device according to claim 3 wherein said mirror support means further includes means for translating said mirror along a second axis, disposed at 90 degrees to said first axis and plane parallel therewith, whereby a selected portion of said reflective areas may be moved in a fashion to change the operating wavelengths of said laser while maintaining differences therebetween constant.

9. A multiple frequency external cavity diode laser comprising:
   a. a diode laser having an output beam;
   b. a collimating lens positioned in said output beam;
   c. a diffraction grating positioned to be impinged by said collimated output beam and provide a first order diffraction beam from said output beam;
   d. reflective means, positioned to be impinged by said first order diffraction beam;
   e. focus means for bringing said first order diffraction beam to a focus on said reflective means;
   f. said reflective means having a plurality of reflective areas positioned to reflect only those portions of said focused first order diffraction beam emerging from said diffraction grating at different diffraction angles, whereby the oscillation of said laser is maintained at frequencies corresponding to the diffraction angles of said reflected first order diffraction beams and wherein said reflective areas are oriented to intercept and reflect two portions of said focused first order diffraction beam whereby said laser simultaneously oscillates at two wavelengths.

10. A device according to claim 9 further including: mirror support means for translation of said mirror along a first axis, transverse to the optical axis of said first order diffraction beam, whereby the pattern of reflective areas may be moved to intercept different portions of said first order diffraction beam and thereby also provide different operating wavelengths of said laser.

11. A device according to claim 10 wherein said plurality of reflective areas comprise a "V" shaped pattern.

12. A device according to claim 11 wherein the legs of the "V" shaped pattern are disposed at equal angles with respect to the axis of translation to provide equal changes in wavelength when said mirror is translated along said first axis.

13. A device according to claim 12 wherein said reflective areas comprise:
   a. a first reflective area extending along a line positioned parallel to an axis of translation of said mirror;
   b. a second reflective area extending along a line positioned at an angle with respect to the axis translation of said mirror.

14. A device according to claim 13 wherein said first and second reflective areas are relatively narrow with respect to the width of said collimated first order diffraction beam to provide laser output wavelengths of high spectral purity.

15. A device according to claim 14 wherein said mirror support means further includes means for translating said mirror along a second axis, disposed at 90 degrees to said first axis and plane parallel therewith, whereby a selected portion of said reflective areas may be moved in a fashion to change the operating wavelengths of said laser while maintaining differences therebetween constant.

16. A multiple frequency external cavity diode laser comprising:
   a. a diode laser having an output beam;
   b. a collimating lens positioned in said output beam;
   c. a diffraction grating positioned to be impinged by said collimated output beam and provide a first order diffraction beam from said output beam;
   d. reflective means, positioned to be impinged by said first order diffraction beam;
   e. focus means for bringing said first order diffraction beam to a focus on said reflective means;
   f. said reflective means having a plurality of reflective areas positioned to reflect only those portions of said focused first order diffraction beam emerging from said diffraction grating at different diffraction angles, whereby the oscillation of said laser is maintained at frequencies corresponding to the diffraction angles of said reflected first order diffraction beams and wherein said reflective areas are oriented to intercept and reflect two portions of said focused first order diffraction beam whereby said laser simultaneously oscillates at two wavelengths.
   g. mirror support means for translation of said mirror along a first axis, transverse to the optical axis of said first order diffraction beam, whereby the pattern of reflective areas may be moved to intercept different portions of said first order diffraction beam and thereby also provide different operating wavelengths of said laser.

17. A device according to claim 16 wherein said plurality of reflective areas comprise a "V" shaped pattern.

18. A device according to claim 16 wherein the legs of the "V" shaped pattern are disposed at equal angles with respect to the axis of translation to provide equal changes in wavelength when said mirror is translated along said first axis.

19. A device according to claim 16 wherein said reflective areas comprise:
   a. a first reflective area extending along a line positioned parallel to an axis of translation of said mirror;
   b. a second reflective area extending along a line positioned at an angle with respect to the axis of translation of said mirror.

20. A device according to claim 16 wherein said first and second reflective areas are relatively narrow with respect to the width of said collimated first order diffraction beam to provide laser output wavelengths of high spectral purity.

* * * * *